United States Patent
Zortea

(10) Patent No.: US 8,134,410 B1
(45) Date of Patent: Mar. 13, 2012

(54) TRANSCEIVER GAIN CALIBRATION

(75) Inventor: Anthony Eugene Zortea, Pipersville, PA (US)

(73) Assignee: PMC-Sierra, Inc., Sunnyvale, CA (US)

( * ) Notice: Subject to any disclaimer, the term of this patent is extended or adjusted under 35 U.S.C. 154(b) by 443 days.

(21) Appl. No.: 12/488,919

(22) Filed: Jun. 22, 2009

(51) Int. Cl.
*H03F 3/04* (2006.01)

(52) U.S. Cl. ............... 330/310; 330/284; 455/127.2; 455/232.1; 455/241.1; 455/249.1; 455/341

(58) Field of Classification Search .......... 330/278, 330/284, 310; 455/127.2, 232.2, 241.1, 341
See application file for complete search history.

(56) References Cited

U.S. PATENT DOCUMENTS

| | | | |
|---|---|---|---|
| 6,819,910 B2 | 11/2004 | Shi et al. | |
| 6,850,119 B2 * | 2/2005 | Arnott | 330/298 |
| 7,212,069 B2 * | 5/2007 | Schell et al. | 330/10 |
| 7,496,338 B1 * | 2/2009 | Groe et al. | 455/240.1 |
| 7,616,055 B2 * | 11/2009 | Pan | 330/51 |
| 2006/0264192 A1 | 11/2006 | Kuo et al. | |
| 2008/0096500 A1 | 4/2008 | Eilts et al. | |
| 2010/0097144 A1 * | 4/2010 | Rofougaran | 330/278 |

* cited by examiner

*Primary Examiner* — Michael Shingleton
(74) *Attorney, Agent, or Firm* — Knobbe Martens Olson & Bear LLP

(57) ABSTRACT

Transceivers with multiple gain stages that include open loop and closed loop amplifiers are subject to differential non-linearity (DNL) errors in their total gain versus gain index curve due to the gain step variability of the open loop amplifiers. The initial and time varying DNL can be reduced by a control loop that uses the relative gain step precision of the closed loop amplifiers and of passive attenuators to establish a control loop to reduce the DNL of the total gain.

16 Claims, 10 Drawing Sheets

TRANSCEIVER GAIN CALIBRATION

BACKGROUND

1. Field of the Invention

The invention generally relates to electronics and in particular, to physical layer transceivers (including transmitter/receivers) with cascaded analog amplifiers.

2. Description of the Related Art

Many transceivers, such as a wireless radio frequency integrated circuit (RFIC), use multiple gain stages including open and closed loop amplifiers—each of which has multiple gain settings—to achieve an overall variable gain amplifier (VGA) with multiple gain settings.

Differential non-linearity (DNL) can be a problem with variable gain amplifiers. DNL refers to the deviation (from the ideal) in gain between two adjacent gain settings. The problem with DNL is typically most acute when more than one gain stage of a VGA is adjusted to switch between the two adjacent gain settings. For example, a particular gain stage can have a step size that is larger than the step size for the VGA as a whole, and when that gain stage is adjusted as part of a gain adjustment for the VGA, the DNL can be relatively high. When DNL is relatively high, gain adjustments can behave in unexpected ways, and can result in, for example, saturation of receiver stages, increases in bit error rates, etc.

It is desirable that the VGA as a whole has relatively small DNL in the total gain versus gain index curve. Absolute gain errors are usually not an issue because an automatic gain control (AGC) loop typically operates to establish the absolute gain of the system.

To illustrate, suppose the receiver or transmitter of a transceiver has two gain stages 602, 604 (FIG. 6) with gain $G_1$ and $G_2$, respectively. Each stage 602, 604 has multiple gain settings, as show below in Equation 1.

$$G_1 = \{g_{11}, g_{12}, g_{13} ...\} \quad \text{Equation 1}$$
$$G_2 = \{g_{21}, g_{22}, g_{23}, g_{24}, ...\}$$

Typically, one 602 of the gain stages with gain $G_1$ in this example, has relatively few but relatively large gain steps, and the other stage 604, with gain $G_2$ in this example, has relatively many but relatively small gain steps. Mathematically, the gain steps then observe the relationships expressed in Equation 2.

$$g_{(1)(x)} - g_{(1)(x-1)} \gg g_{(2)(y)} - g_{(2)(y-1)} \text{length}(G_2) \gg \text{length}(G_1) \quad \text{Equation 2}$$

When expressed as a logarithmic gain in decibels (dB), the total gain $G_{total}$ with index n is as shown in Equation 3.

$$G_{total}[n] = G_1[f_1(n)] + G_2[f_2(n)] \quad \text{Equation 3}$$

The functions $f_1$ and $f_2$ map the total gain index n to the gain required from each stage. Note that the index at which the larger step size gain stage 602 having gain $G_1$ changes from lower to higher gain is referred to as index "B". Note also that this is for purposes of illustration only and that the larger step size gain stage 602 with gain $G_1$ can have any number of gain steps. The gain mapping can take the form illustrated with Equation 4.

$$f_1(n) = 1; n < B \quad \text{Equation 4}$$
$$f_1(n) = 2; n \geq B$$
$$f_2(n) = n; n < B$$
$$f_2(n) = n - (B - 1); n \geq B$$

To illustrate, consider the gain vectors in Equation 5.

$$G_1 = \{2, 14\} dB \quad \text{Equation 5}$$
$$G_2 = \{-5, -4, -3, ... 10, 11, 12\} dB$$

To achieve an overall linear gain, assuming that the gain step for the larger step size gain stage 602 with gain $G_1$ occurs at B=11, the gain mapping functions can be as shown in Equation 6.

$$f_1(n) = 1; n < 11 \quad \text{Equation 6}$$
$$f_1(n) = 2; n \geq 11$$
$$f_2(n) = n; n < 11$$
$$f_2(n) = n - (11 - 1); n \geq 11$$

An example of the individual gain characteristics of each gain stage 602, 604 having gains $G_1$ and $G_2$, respectively, and the total gain $G_{total}$ versus the gain index is shown in FIG. 1. In FIG. 1, gain is expressed along the vertical axis and the index is expressed along the horizontal axis. FIG. 1, labeled as "prior art," represents the ideal case, which is rarely achieved due to process, voltage, and temperature variations.

FIG. 4 illustrates an example of a gain profile in which the open loop RF gain step for the larger step size gain stage 602 has some gain imprecision.

SUMMARY OF THE DISCLOSURE

Transceivers can utilize multiple gain stages. In many cases, two or more gain stages of a transceiver are adjusted to adjust the overall gain. When gain is adjusted, differential non-linearity (DNL) can cause variability in the total gain. According to an embodiment of the invention, an attenuator stage is placed in the signal path to trim the gain to correct the DNL.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Two problems typically exist when attempting to reduce differential non-linearity (DNL): (1) there is variability in the gain vectors (causing uncertainty in the gain steps), and (2) there is variability in power or amplitude measurements used for calibration. Equations illustrating variability are collectively labeled Equation 7.

$$G_1 = \{g_{11}, g_{12}, g_{13} \ldots \} + \{\varepsilon_{11}, \varepsilon_{12}, \varepsilon_{13}, \ldots\} \quad \text{Equation 7}$$

$$G_2 = \{g_{21}, g_{22}, g_{23}, g_{24}, \ldots\} +$$

$$\{\varepsilon_{21}, \varepsilon_{22}, \varepsilon_{23}, \varepsilon P_{est}(P_{actual}) = P_{actual} + \varepsilon_P(P_{actual})$$

In Equation 7, variable $\varepsilon_P$ represents the variability of the power (or amplitude) measurement block, which is a function of the actual power or amplitude; and $\varepsilon_{kx}$ is the variability of gain stage k setting x. For the case for which a gain stage is closed loop, the variability approaches zero ($\varepsilon_{kx} \rightarrow 0$) for that gain stage.

Figure 1:
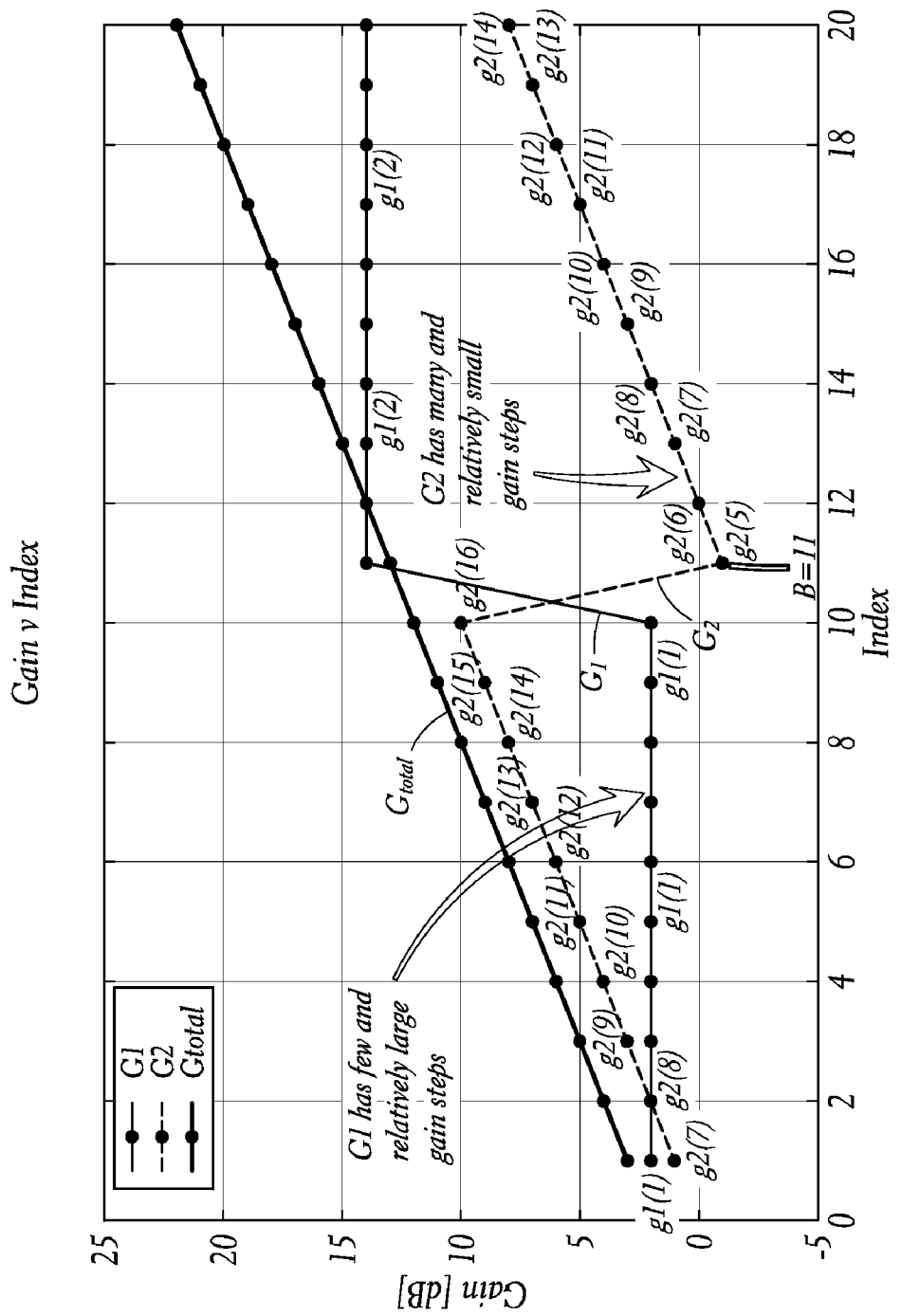
FIG. 1 illustrates gain versus gain index for an ideal case.
Figure 2:
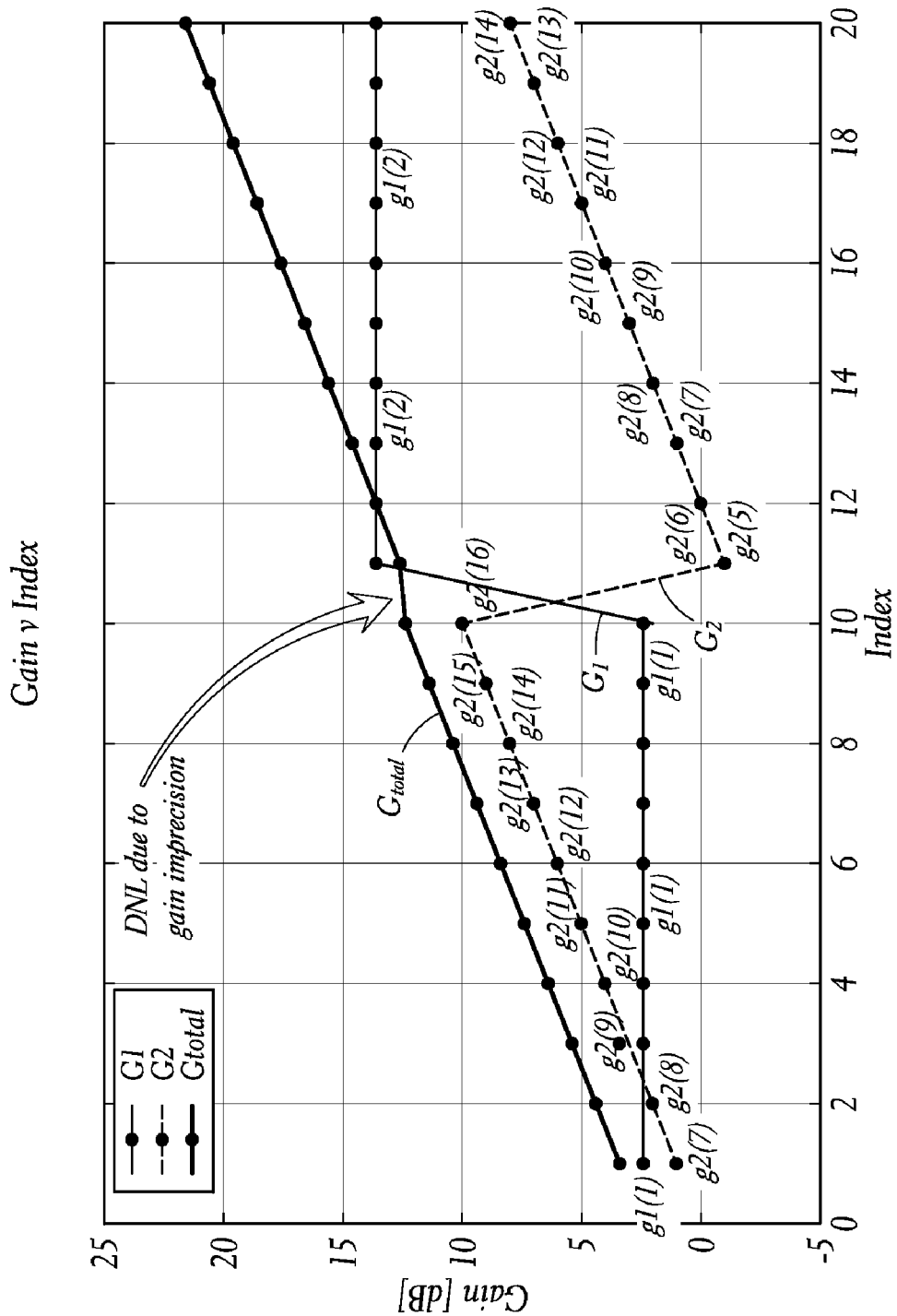
FIG. 2 illustrates gain versus gain index with the presence of differential nonlinearity (DNL).

In an example in which the larger step size gain stage 602 with $G_1$ is an RF open loop amplifier with $\varepsilon_{1x} \neq 0$, there can be significant nonzero DNL as illustrated in FIG. 2.

Figure 3:
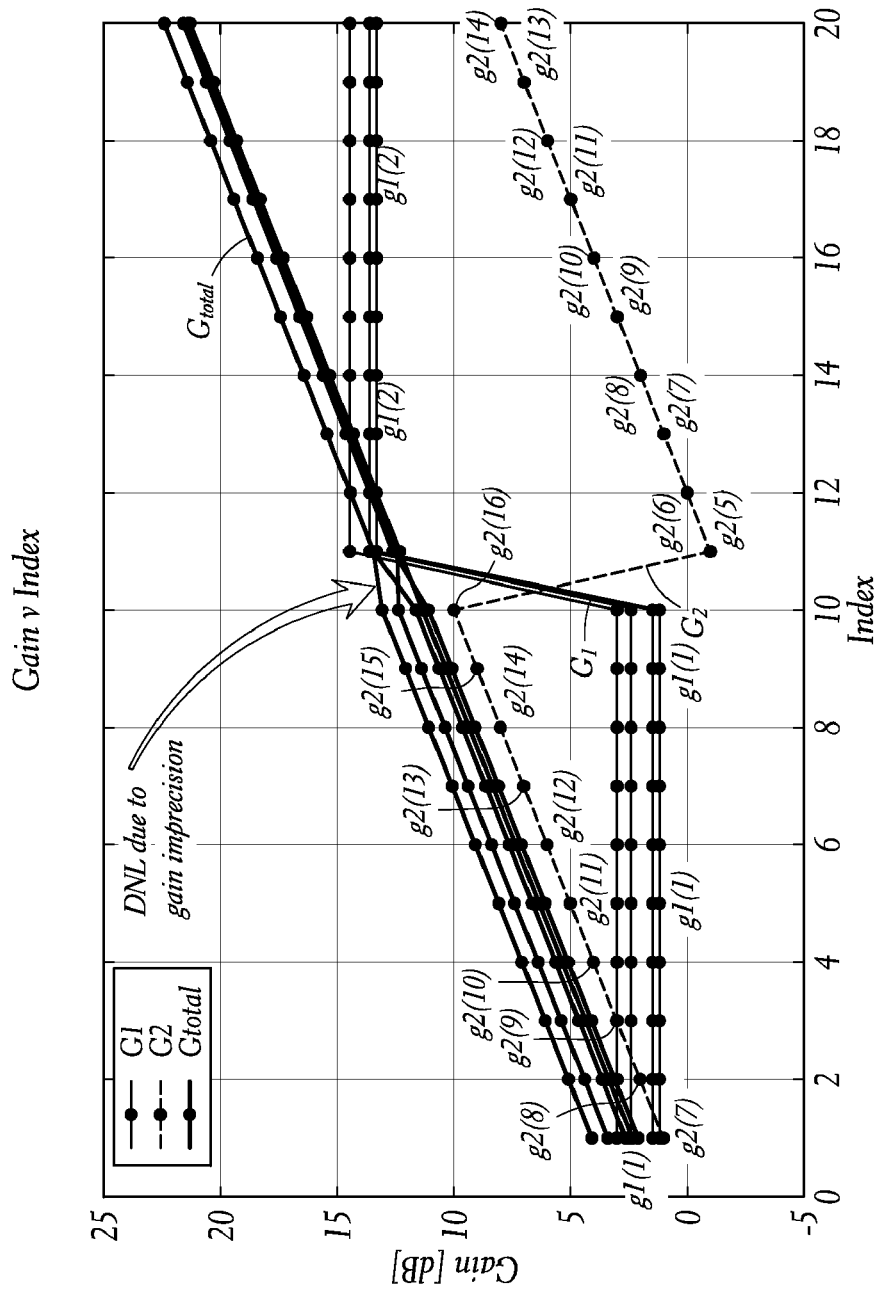
FIG. 3 illustrates gain versus gain index with the addition of time-varying gain uncertainty. Multiple traces for the gain $G_1$ illustrate gain profiles at different times.

Furthermore, the gain step variability can be both non-zero and a function of time or temperature, or some other independent variable, that is, $\varepsilon_{1x} \neq 0 = f(time)$. An example of this is illustrated in FIG. 3. In FIG. 3, overlaid are examples of the independent and total gains with $\varepsilon_{1x} \neq 0 = f(time)$. Multiple traces for the gain $G_1$ in FIG. 3 illustrate gain profiles at different times.

As a result of the sources of variability discussed earlier in connection with FIGS. 2 and 3, two calibration procedures can be introduced: initial calibration and calibration for gain drift. The initial calibration is intended to be performed at the factory or power-up time, and the drift calibration is intended to run during field operation of a device, such as a 2-way radio, cell phone, modem, wireless access point, or the like. Such devices can include analog and digital electronic circuits. In addition, some portions can be performed by dedicated devices and other portions by a processor configured to execute instructions stored in a computer readable medium.

In one embodiment, both calibration procedures are used. In an alternative embodiment, only the drift calibration is used, but the drift calibration can take some time to converge to a solution because of possible non-linearities in the gain curve.

The following describes the calibration of the transceiver gain in the context of a wireless radio frequency integrated circuit (RFIC) transmitter. However, transceiver gain paths of other devices can be similarly calibrated.

One embodiment of the invention provides relative gain calibration (a linear gain curve) without depending on the accuracy of the gain settings or the accuracy of the gain measurement block.

Figure 4:
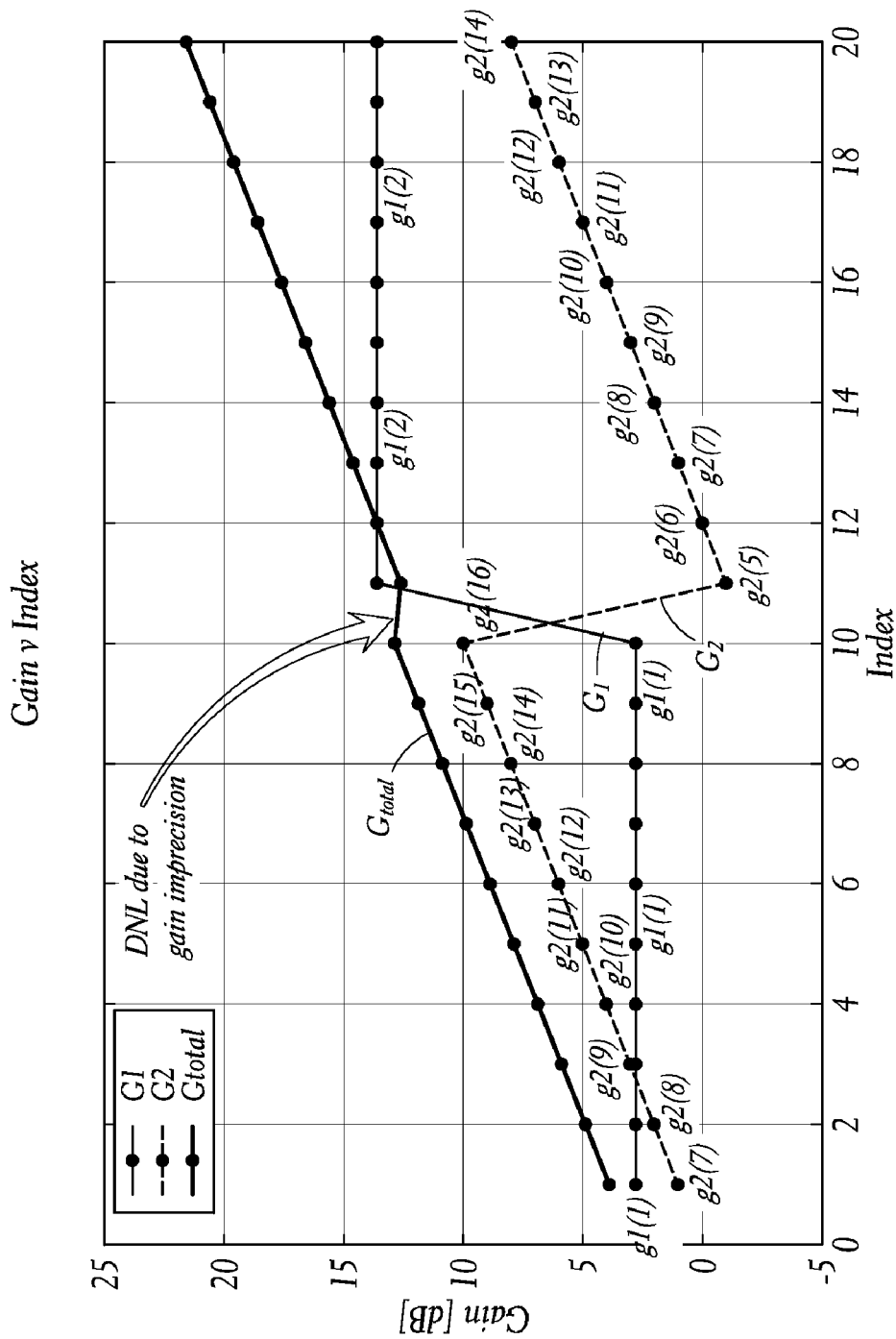
FIG. 4 illustrates gain versus gain index with differential nonlinearity (DNL) due to gain step variability.

As illustrated in FIG. 4, the differential non-linearity (DNL) in the total gain curve $G_{total}$ is primarily caused by the imprecision in the gain step $g_{(1)(2)} - g_{(1)(1)}$. When a relatively accurate attenuator stage 606 with gain $G_3$ is introduced, the attenuator stage 606 can compensate for the gain step imprecision of the larger step size gain stage 602 with $G_1$, and the DNL can be reduced as illustrated in FIG. 5.

Figure 5:
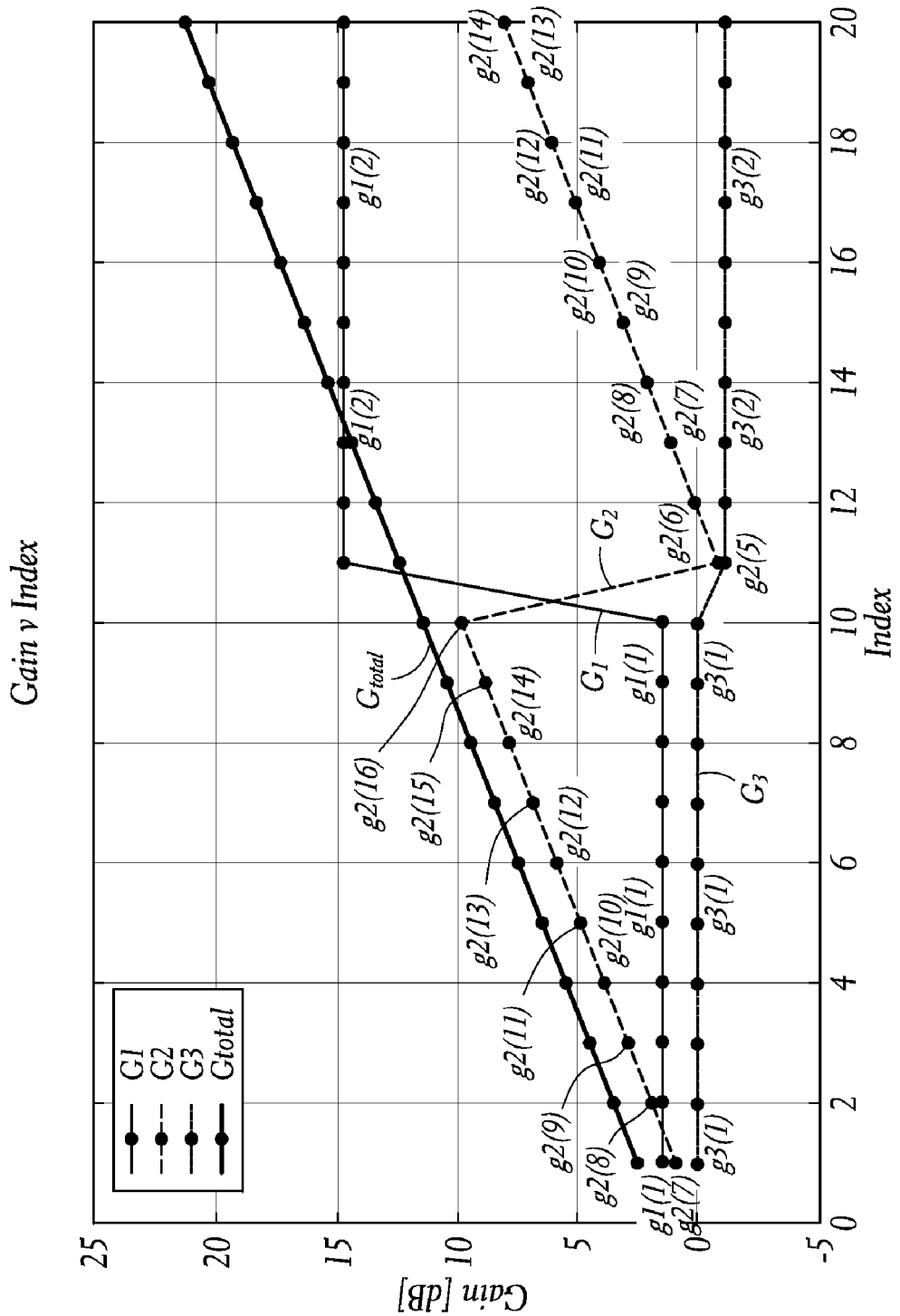
FIG. 5 illustrates gain versus gain index with DNL and the addition of an attenuator stage to reduce the DNL.

With reference to FIG. 5, one embodiment of the invention finds the value for the correction of the gain step $G_3$ ($g_{(3)(2)} - g_{(3)(1)}$) of the attenuator stage 606 and finds the gain mapping value $f2(B)$ at index B=11, or $f2(11)$; both without depending on specific absolute accuracy in a power or amplitude measurement block. In one embodiment, the attenuator stage 606 corresponds to a passive attenuator, such as one fabricated with passive resistors. Resistors of different values can be switched to change the amount of attenuation. In addition, while the action of an attenuator is loss, loss in decibels corresponds to negative gain and will still be referenced by gain or loss G.

Figure 6:
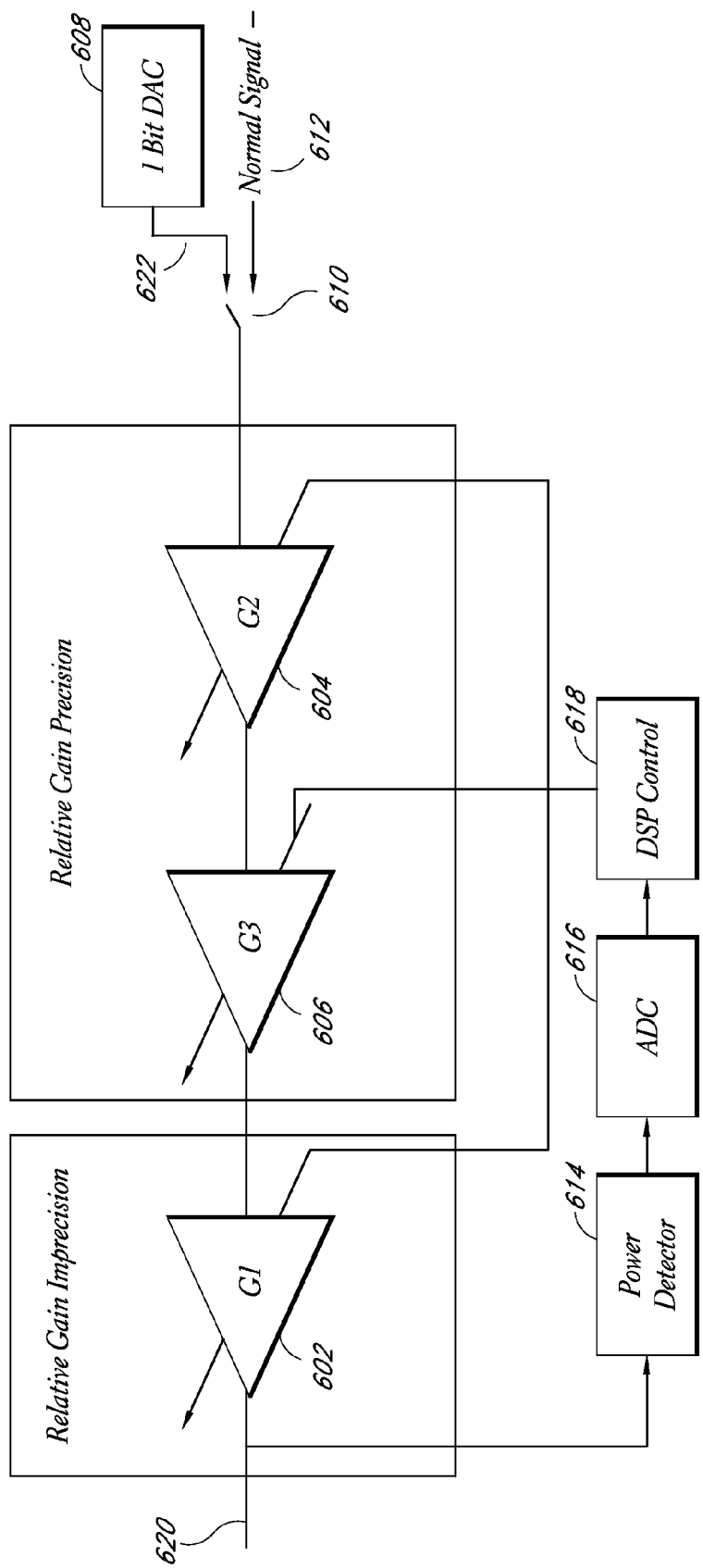
FIG. 6 illustrates an example of an architecture with the attenuator stage.

An example of an architecture useful for the initial gain calibration is illustrated in FIG. 6. The architecture can be used in, for example, a front-end of a receiver and/or a transmitter of a transceiver, a transmitter/receiver, a transmitter, or a receiver. While the gain stages and attenuator stages are illustrated in a particular order, in an alternative embodiment, the order can change.

In the illustrated embodiment, during initial calibration mode, a 1-bit DAC 608 generates a simple square wave to serve as a reference signal. A switch 610, which can be a multiplexer, permits a device to switch from the calibration signal 622 of the DAC 608 or from the normal signal 612, which can be coupled to an antenna. A square wave will suffice, but other reference signals can alternatively be used, such as, but not limited to, a tone generator, a noise generator, an oscillator, or the like. For the case of a wireless RFIC, the "Power Detector" 614 can be an envelope detector. In an alternative embodiment, the power detector 614 can be an amplitude detector. This power estimate is digitized with an ADC 616 (and can be averaged to reduce noise). The power estimate is used by the DSP Control 618 to decrease the DNL of the total gain. The DSP Control 618 can be a processor, a general-purpose digital signal processor, a microprocessor, a microcontroller, a licensable core, or the like. The DSP Control 618 is typically configured to execute instructions stored on a tangible medium.

Referring to FIG. 5, one embodiment of the gain linearization technique can be broken down into two general steps: (1) Determine a value for the gain mapping value $f2(B)$, which is preferably the $G_2$ gain step setting for the smaller step size gain stage 604 at index B (when the larger step size gain stage 604 with gain $G_1$ steps its gain) that results in the closest gain overall setting $G_{total}$. In one embodiment, the step size of the smaller step size gain stage 604 is less than half the step size of the larger step size gain stage 602 (in decibels). In addition, the setting of the gain (loss) $G_3$ of the attenuator 606 when finding the mapping value $f2(B)$ should also be known. For example, if the attenuator 606 is set to maximum attenuation during calibration of the gain mapping value $f2(B)$, then the gain mapping value $f2(B)$ should be selected so that the overall gain setting $G_{total}$ is lower than desired so that the attenuator 606 has room to adjust the gain higher. On the other hand, if the attenuator 606 is set to minimum attenuation during calibration of the gain mapping value $f2(B)$, then the value selected for the gain mapping value ƒ2(B) should result in a higher than desired total gain $G_{total}$ so that the attenuator 606 has the headroom to trim the gain to the desired value; and (2) Determine a value for the gain $G_3$ of the attenuator stage 606 at index B to trim the gain $G_{total}$.

Figure 7:
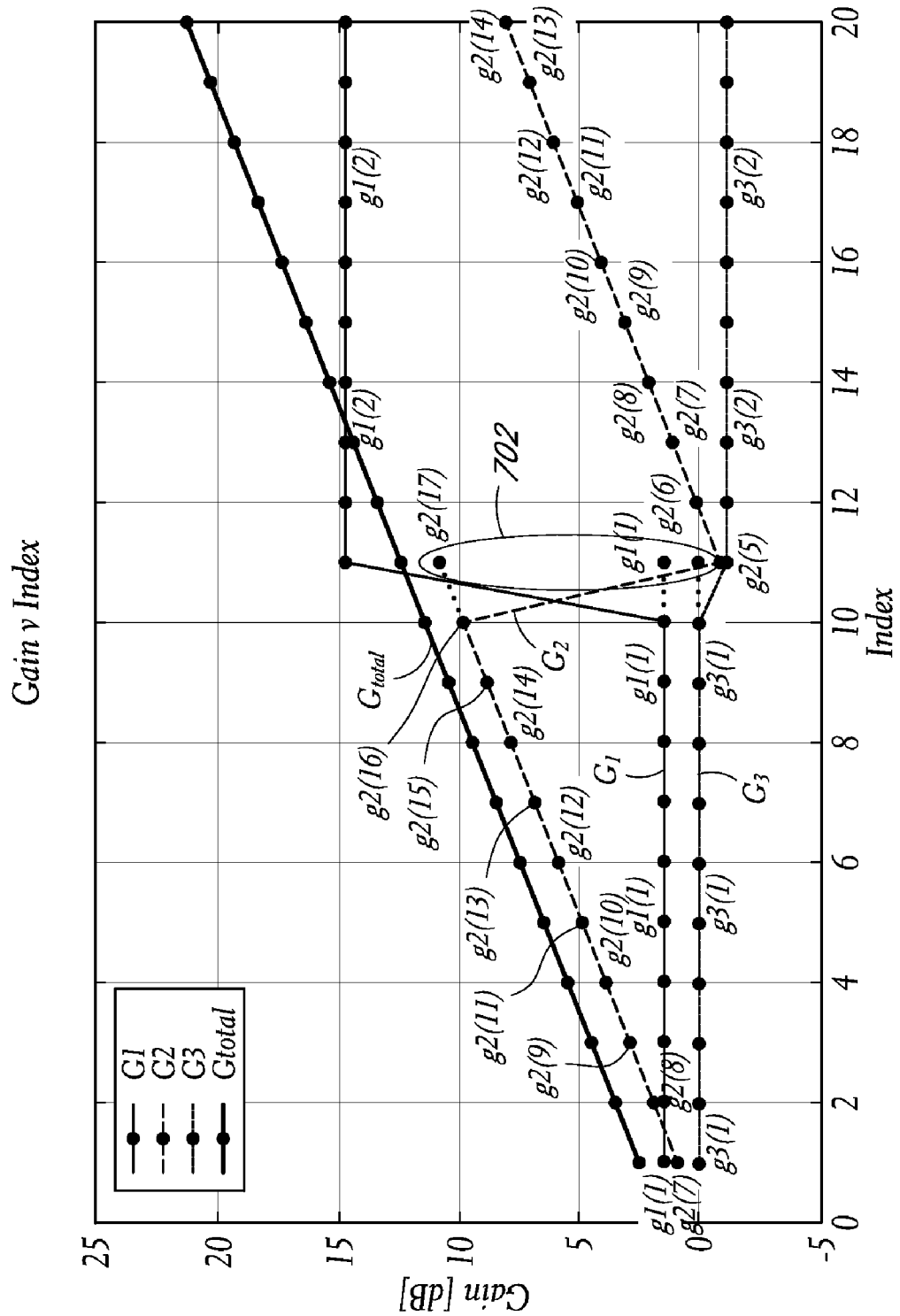
FIG. 7 illustrates gain versus gain index with a gain $G_2$ of a smaller step size gain stage artificially set to a higher gain to establish a reference power estimate.
Figure 8:
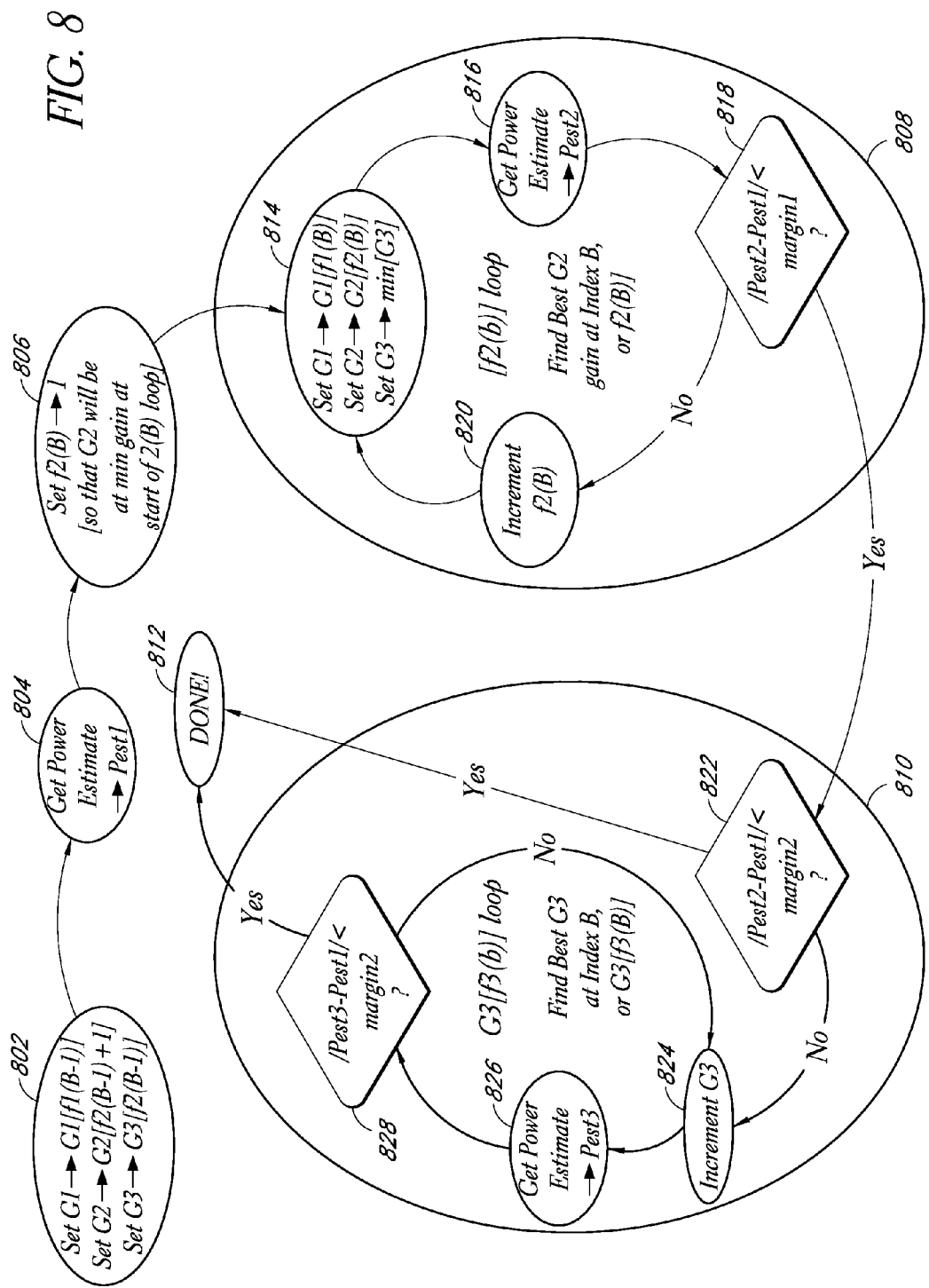
FIG. 8 illustrates a process for initial gain calibration.

Calibration is achieved by using the relatively precise gain steps of the smaller step size gain stage 604 with gain $G_2$ (and the attenuator stage 606 with gain $G_3$) to establish a reference power measurement. FIGS. 7 and 8 illustrate calibration.

FIG. 7 illustrates calibration in connection with a chart of gain versus index. The calibration process is controlled by the DSP Control 618, which can include program instructions executed by a processor. In an alternative embodiment, the DSP Control 618 can be implemented by control logic or a combination of both control logic and a processor. During normal operation, the larger step size gain stage 602 with gain $G_1$ is normally set at its higher gain setting at the gain index point B. During calibration, the larger step size gain stage 602 with gain $G_1$ is instead set to its lower gain setting at the gain index point B, and the attenuator stage 606 with gain $G_3$ is set at its less gain than index point B (<B) setting (index B=11 in the illustrated example), which can be, for example, minimum attenuation. The smaller step size gain stage 604 with gain $G_2$, with its relatively precise gain step, is increased one setting beyond its maximum <B index setting and a power estimate is made. The temporary calibration setting is circled 702 in FIG. 7.

This allows the relatively accurate gain step $G_2$ of the smaller step size gain stage 604 to serve as a reference for the relatively inaccurate gain step $G_1$ of the larger step size gain stage 602.

Then, the gain $G_1$ of the larger step size gain stage 602 is adjusted to its normal higher gain setting for index point B, and the smaller step size gain stage 604 with gain $G_2$ and the attenuator stage 606 with $G_3$ are adjusted until the new power estimate is equal to the earlier power estimate, as explained in detail later in connection with FIG. 8.

If these measurements are made close enough in time so that drift in the power detector 614 is negligible, then the accuracy of the power detector 614 is not critical because the power detector 614 should see the same input signal level for both estimates. However, the power detector 614 should be able to provide repeatable results.

FIG. 8 illustrates an example of a process for initial gain calibration. It will be appreciated by the skilled practitioner that the illustrated process can be modified in a variety of ways. For example, in another embodiment, various portions of the illustrated process can be combined, can be rearranged in an alternate sequence, can be removed, or the like. The process can be performed by the DSP Control 618. The process illustrates initialization states 802, 804, 806, a first loop 808, and a second loop 810. When complete, the process ends 812.

The various gain stages and attenuator stages are set in the state 802. A power estimate is generated from data retrieved from the power detector 614 via analog-to-digital converter (ADC) 616 in 804. For example, power readings can be average to filter noise.

The smaller step size gain stage 604 is then initialized to minimum gain in the state 806 before entering the first loop 808.

The first loop 808 determines an appropriate gain setting $G_2$ for the smaller step size gain stage 604. Within the first loop 808, the gain stages and attenuator stages are set in a state 814. The attenuator 606 with gain $G_3$ is set to minimum attenuation. Power sensed by the power detector 614 is obtained in a state 816.

In a decision block 818, the power readings obtained in the state 804 and in the state 816 are compared to a variable labeled "margin1" in FIG. 8. In the illustrated embodiment, since the gain stage 604 steps up from minimum gain, the value found will be the first value that is within the threshold (in terms of absolute value). In one embodiment, the variable margin1 corresponds to a predetermined value. If the power readings are close, as indicated by their difference being less than margin1, then the process has obtained an appropriate setting for the gain $G_2$ of the smaller step size gain stage 604 and proceeds to the second loop 810. Otherwise, the process increments the setting for the gain mapping value ƒ2(B), which increases the gain of the second gain stage 604, and the process returns to the state 814.

The second loop 810 determines an appropriate setting for the gain (loss) $G_3$ of the attenuator stage 606 to further trim the gain setting. At the start of the second loop 810, a decision block 822 determines whether the power estimate from prior state 816 and prior state 804 are within a second threshold margin2, which should be significantly smaller than the threshold value margin1. If the power estimates are within the second threshold margin2, then no further trimming is needed and the process ends by proceeding to the state 812.

If the power estimates are outside the second threshold margin2, then the process proceeds from the decision block 822 to a state 824 in which the attenuator stage 806 with gain (loss) $G_3$ is adjusted (higher or lower depending on the initial setting of the attenuator stage), and a new power estimate is retrieved in the state 826.

The process then proceeds to a decision block 828 to compare the power estimated in the state 826 to the power estimated in the state 804. If the power estimates are within the second threshold margin2, then the process is complete and proceeds to the state 812. Otherwise, the process returns to the state 824 to test additional values for the setting of the attenuator stage 806 with gain (loss) $G_3$.

As described above, the gain $G_1$ of the larger step size gain stage 602 can drift with time and/or temperature and so further calibration can be used. It is desirable for continuous operation to avoid switching to a special calibration signal 622 for gain drift calibration and so the preceding "initial calibration" procedure described earlier should not be used. Instead, the normal transceiver signal can be used during this "in use" calibration.

Figure 9:
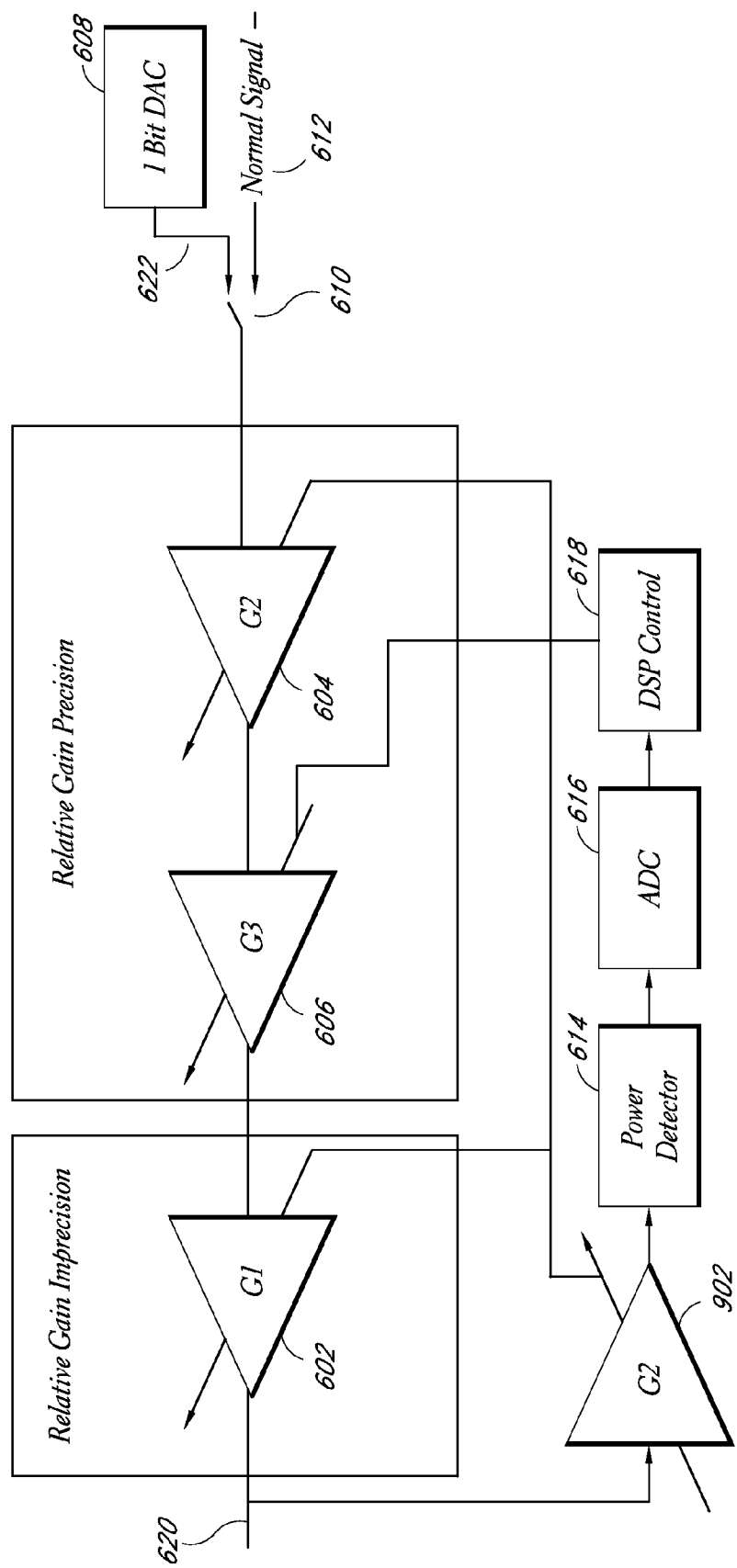
FIG. 9 illustrates an architecture capable of calibration with a normal signal, wherein the architecture has a second attenuator stage.

An additional block 902 (FIG. 9) with gain $G_4$ can be used to achieve gain drift calibration without having to use the special calibration signal 622 and violating the overall absolute gain of the system as controlled by the AGC loop. This permits the drift calibration to proceed without disruption to processing of the normal signal 612. The block 902 with gain $G_4$ can correspond to an attenuator 902 in a measurement signal path before the power detector 614, and an example of an architecture is shown in FIG. 9.

Insensitivity to power detector 614 accuracy is also achieved with the relatively accurate gain step attenuator 902 with loss $G_4$, which in the case of a wireless transmitter, can be an RF attenuator.

Figure 10:
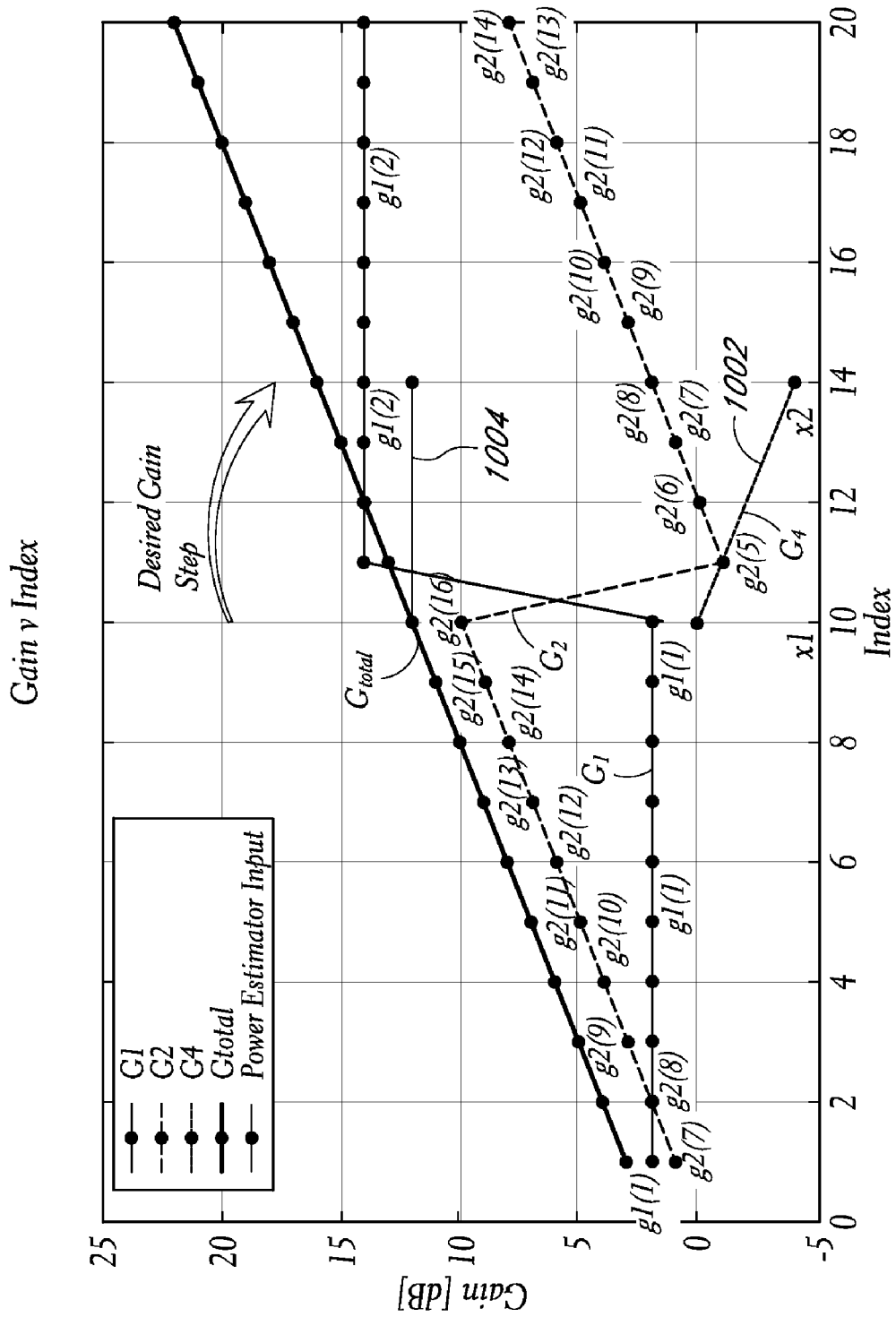
FIG. 10 illustrates gain versus gain index and calibration control of the second attenuator stage with gain (loss) $G_4$.

The gain (loss) $G_4$ of the attenuator 902 is changed only before or after a total gain adjustment that includes a $G_1$ gain step. In one embodiment, the attenuator 902 has two states: minimum attenuation and maximum attenuation, wherein the difference in attenuation between minimum attenuation and maximum attenuation corresponds to a particular set of one or more gain steps. In an alternative embodiment, the attenuator 902 has more than two states and the attenuation amounts referred to as minimum attenuation and maximum attenuation can be endpoints or intermediate points of attenuation. In FIG. 10, the illustrated difference between x2 (index 14) and x1 (index 10) is 4 gain steps. However, the difference can be one or more steps. With little or no DNL, the power detector 614 should sense the same relative input level, which obviates the need for absolute accuracy in the power detector 614, and the attenuator 606 with gain G3 is adjusted until the power levels are the same.

In one case (shown in FIG. 10), as index=x1<B, the attenuator 902 with loss $G_4$ is set to minimum attenuation. After the index is increased to a value x2>=B, where gain $G_1$ is increased to $G_1(f1(x2))$, gain (loss) $G_4$ is set as illustrated in Equation 8.

$$G_4 = G_t(x1) - G_t(x2) \qquad \text{Equation 8}$$

In the other case (not shown), as the index=x1 approaches index point B from a direction greater than the index point B, (from the right in FIG. 10), gain (loss) $G_4$ is set to maximum attenuation. Then, after the index is x2<B, gain (loss) $G_4$ is set as illustrated in Equation 9.

$$G_4 = G_t(x2) - G_t(x1) \qquad \text{Equation 9}$$

In either case, the attenuator 606 with gain $G_3$ is adjusted at index x2 until the power estimate at x2 is equal to the power estimate at x1. The input to the power detector 614 is the same for both estimates, which provides insensitivity to the absolute accuracy of the power detector 614. An example of this is illustrated in FIG. 10. In FIG. 10, gain $G_4$ is adjusted 1002 until the input to the power detector 614 is equal before and after the gain step as illustrated by line 1004.

While the architecture and algorithm is shown in the context of a wireless transmitter, any transceiver gain path (using some open loop and some closed loop amplifiers) can be calibrated according to the principles described earlier.

Although only two gain stages 602, 604 with gains $G_1$ and $G_2$, respectively, are shown in the examples, any number of gain stages can be similarly calibrated.

Furthermore, although only 1 gain step is shown for the gain stage 602 with gain $G_1$, any number of gain steps can be similarly calibrated.

In one embodiment, the gain stage 604 with gain $G_2$ and the attenuator stage 606 with gain $G_3$ can be considered to be a single stage in which adjustment of gain $G_2$ is the "coarse" adjustment and adjustment of gain $G_3$ is the "fine" adjustment.

Various embodiments have been described above. Although described with reference to these specific embodiments, the descriptions are intended to be illustrative and are not intended to be limiting. Various modifications and applications may occur to those skilled in the art.

What is claimed is:

1. An apparatus having a controllable gain, the apparatus comprising:
a first gain stage, wherein the first gain stage is configured to provide a first adjustable positive gain, wherein the first gain stage has a first step size for gain adjustment, wherein the first adjustable positive gain is adjustable at least to a first gain or a second gain, wherein the second gain is larger than the first gain;
a second gain stage, wherein the second gain stage is configured to provide a second adjustable positive gain, wherein the second gain stage has a second step size that is less than half the size of the first step size for gain adjustment;
an attenuator stage, wherein the attenuator stage is configured to provide adjustable loss, wherein the attenuator stage has a third step size smaller than the second step size for attenuation adjustment, wherein the first gain stage, the second gain stage, and the attenuator stage are cascaded in a forward signal path; and
a control circuit configured to control gain of at least one of the first gain stage or the second gain stage for adjustment of at least a part of the total gain, wherein for at least one incremental adjustment of the total gain, the control circuit is configured to adjust the gains of the first gain stage and the second gain stage in opposite directions from each other and to adjust the attenuation of the attenuator stage to reduce differential non-linearity.

2. The apparatus of claim 1, further comprising a power or amplitude detector configured to sense power or amplitude at a point in the forward signal path after the first gain stage, the second gain stage, and the attenuator stage, wherein the control circuit is configured to determine an attenuation setting for the attenuator stage for reduction of differential non-linearity, wherein for an incremental gain adjustment from an index B−1 to an index B, wherein gain at index B is higher than gain at index B−1, the control circuit is further configured:
to set the gain of the first gain stage to the first gain for index B−1 and to the second gain for index B for normal operation;
to set the gain, for calibration, of the first gain stage to the first gain for index B for calibration of the attenuator stage;
to set the gain of the second gain stage to a third gain for index B−1 and to a fourth gain for index B for normal operation, wherein the fourth gain is lower than the third gain;
to set the gain of the second gain stage to a fifth gain for index B for calibration, wherein the fifth gain is higher than the third gain;
to set the attenuation of the attenuator stage to a first attenuation amount for index B−1 and to a second attenuation amount for index B;
to estimate power or amplitude sensed by the power or amplitude detector of at least a portion of the forward signal path that includes at least the first gain stage, the second gain stage, and the attenuator stage with the gains set to calibration settings for index B;
to adjust a gain setting of the second gain stage until a new power or amplitude estimate is about equal to the prior power or amplitude estimate to within a first threshold difference value, and to store the gain setting as the fourth gain; and
to adjust the attenuation of the attenuator stage after adjusting the gain setting of the second gain stage until a new power or amplitude estimate from the power or amplitude detector is about equal to the prior power or or amplitude estimate to within a second threshold difference value, wherein the second threshold difference value is smaller than the first threshold difference value.

3. The apparatus of claim 2, further comprising a switch and a noise source, wherein the switch is controlled by the control circuit such that in normal operation, a normal signal is provided as an input to the forward signal path, and in calibration, a calibration signal from the noise source is provided as an input to the forward signal path.

4. The apparatus of claim 1, further comprising:
a second attenuator stage in a measurement path coupled to an end of the forward signal path, wherein the second attenuator stage is configured to provide at least a first attenuation amount or a second attenuation amount, wherein a difference in attenuation between the second attenuation amount and the first attenuation amount corresponds to one or more step sizes; and a power or amplitude detector having an input coupled to the second attenuator stage, wherein the power or amplitude detector is configured to sense power or amplitude at an output of the second attenuator stage and to provide the sensed power or amplitude to the control circuit;

wherein the control circuit is further configured:

to set the second attenuator stage to the first attenuation amount and estimate power or amplitude sensed by the power or amplitude detector when the gain of the first gain stage, the gain of the second gain stage, and the loss of the attenuator stage are set for a first index point, and to save a value for the estimated power or amplitude as a previously sensed power or amplitude value; and to set the gain of the first gain stage, the gain of the second gain stage, the loss of the second attenuator stage to the second attenuation amount for a second index point, and to adjust the loss of the attenuator stage until the estimated power or amplitude sensed by the power or amplitude detector is about equal to the previously sensed power or amplitude value.

5. The apparatus of claim 1, wherein the control circuit comprises a processor.

6. The apparatus of claim 1, wherein the first gain stage, the second gain stage, and the attenuator stage are radio frequency (RF) stages.

7. A method of reducing differential non-linearity (DNL) for cascaded gain stages having a controllable gain, the method comprising:

controlling gain of at least one of a first gain stage or a second gain stage for adjustment of at least a part of a total gain, wherein the first gain stage, the second gain stage, and an attenuator stage are cascaded, wherein the first gain stage has a first step size for gain adjustment, wherein the second gain stage has a second step size that is less than half the size of the first step size for gain adjustment, wherein the attenuator stage has a third step size smaller than the second step size for attenuation adjustment;

adjusting the gains of the first gain stage and the second gain stage in opposite directions from each other for at least one incremental adjustment of the total gain; and adjusting attenuation of the attenuator stage to reduce differential non-linearity for the at least one incremental adjustment with gains of the first gain stage and the second gain stage being adjusted in opposite directions;

wherein controlling and adjusting are performed by electronic hardware.

8. The method of claim 7, further comprising determining an attenuation setting for the attenuator stage for reduction of differential non-linearity, wherein for an incremental gain adjustment from an index B−1 to an index B, wherein gain at index B is higher than gain at index B−1, the method further comprises:

setting the gain of the first gain stage to the first gain for index B−1 and to the second gain for index B for normal operation;

setting the gain, for calibration, of the first gain stage to the first gain for index B for calibration of the attenuator stage;

setting the gain of the second gain stage to a third gain for index B−1 and to a fourth gain for index B for normal operation, wherein the fourth gain is lower than the third gain;

setting the gain of the second gain stage to a fifth gain for index B for calibration, wherein the fifth gain is higher than the third gain;

setting the attenuation of the attenuator stage to a first attenuation amount for index B−1 and to a second attenuation amount for index B;

estimating power or amplitude of at least a portion of the forward signal path that includes at least the first gain stage, the second gain stage, and the attenuator stage with the gains set to calibration settings for index B;

adjusting a gain setting of the second gain stage until a new power or amplitude estimate is about equal to the prior power or amplitude estimate to within a first threshold difference value, and to store the gain setting as the fourth gain; and adjusting the attenuation of the attenuator stage after adjusting the gain setting of the second gain stage until a new power or amplitude estimate is about equal to the prior power or amplitude estimate to within a second threshold difference value, wherein the second threshold difference value is smaller than the first threshold difference value.

9. The method of claim 8, further comprising controlling a switch such that in normal operation, a normal signal is provided as an input to the forward signal path, and in calibration, a calibration signal from a noise source is provided as an input to the forward signal path.

10. The method of claim 7, further comprising:

setting the second attenuator stage to a first attenuation amount wherein the second attenuator stage is in a measurement path coupled to an end of the forward signal path, wherein the second attenuator stage is configured to provide at least the first attenuation amount or a second attenuation amount, wherein a difference in attenuation between the second attenuation amount and the first attenuation amount corresponds to one or more step sizes;

estimating power or amplitude when the gain of the first gain stage, the gain of the second gain stage, and the loss of the attenuator stage are set for a first index point, and to save a value for the estimated power or amplitude as a previously sensed power or amplitude value;

setting the gain of the first gain stage, the gain of the second gain stage, the loss of the second attenuator stage to the second attenuation amount for a second index point; and adjusting the loss of the attenuator stage until the estimated power or amplitude is about equal to the previously sensed power or amplitude value.

11. The method of claim 7, wherein the first gain stage, the second gain stage, and the attenuator stage are radio frequency (RF) stages.

12. An apparatus having a controllable gain, the apparatus comprising:

a first gain stage, wherein the first gain stage is configured to provide a first adjustable positive gain, wherein the first gain stage has a first step size for gain adjustment, wherein the first adjustable positive gain is adjustable at least to a first gain or a second gain, wherein the second gain is larger than the first gain;

a second gain stage, wherein the second gain stage is configured to provide a second adjustable positive gain, wherein the second gain stage has a second step size that is less than half the size of the first step size for gain adjustment;

an attenuator stage, wherein the attenuator stage is configured to provide adjustable loss, wherein the attenuator stage has a third step size smaller than the second step size for attenuation adjustment, wherein the first gain stage, the second gain stage, and the attenuator stage are cascaded in a forward signal path; and means for controlling the gains of the first gain stage and the second gain stage in opposite directions from each other for at least one incremental adjustment of the total gain, and for adjusting attenuation of the attenuator stage to reduce differential non-linearity for the at least one incremental adjustment with gains of the first gain stage and the second gain stage being adjusted in opposite directions.

13. The apparatus of claim 12, further comprising a power or amplitude detector configured to sense power or amplitude at a point in the forward signal path after the first gain stage, the second gain stage, and the attenuator stage, wherein the controlling means is configured to determine an attenuation setting for the attenuator stage for reduction of differential non-linearity, wherein for an incremental gain adjustment from an index B−1 to an index B, wherein gain at index B is higher than gain at index B−1, wherein the controlling means further comprises:

means for setting the gain of the first gain stage to the first gain for index B−1 and to the second gain for index B for normal operation;

means for setting the gain, for calibration, of the first gain stage to the first gain for index B for calibration of the attenuator stage;

means for setting the gain of the second gain stage to a third gain for index B−1 and to a fourth gain for index B for normal operation, wherein the fourth gain is lower than the third gain;

means for setting the gain of the second gain stage to a fifth gain for index B for calibration, wherein the fifth gain is higher than the third gain;

means for setting the attenuation of the attenuator stage to a first attenuation amount for index B−1 and to a second attenuation amount for index B;

means for estimating power or amplitude sensed by the power or amplitude detector of at least a portion of the forward signal path that includes at least the first gain stage, the second gain stage, and the attenuator stage with the gains set to calibration settings for index B;

means for adjusting a gain setting of the second gain stage until a new power or amplitude estimate is about equal to the prior power or amplitude estimate to within a first threshold difference value, and to store the gain setting as the fourth gain; and means for adjusting the attenuation of the attenuation stage after adjusting the gain setting of the second gain stage until a new power or amplitude estimate from the power or amplitude detector is about equal to the prior power or amplitude estimate to within a second threshold difference value, wherein the second threshold difference value is smaller than the first threshold difference value.

14. The apparatus of claim 13, further comprising a switch and a noise source, wherein the switch is controlled by the control circuit such that in normal operation, a normal signal is provided as an input to the forward signal path, and in calibration, a calibration signal from the noise source is provided as an input to the forward signal path.

15. The apparatus of claim 12, further comprising:

a second attenuator stage in a measurement path coupled to an end of the forward signal path, wherein the second attenuator stage is configured to provide at least a first attenuation amount or a second attenuation amount, wherein a difference in attenuation between the second attenuation amount and the first attenuation amount corresponds to one or more step sizes; and a power or amplitude detector having an input coupled to the second attenuator stage, wherein the power or amplitude detector is configured to sense power or amplitude at an output of the second attenuator stage and to provide the sensed power or amplitude to the controlling means;

wherein the controlling means further comprises:

means for setting the second attenuator stage to the first attenuation amount and estimate power or amplitude sensed by the power or amplitude detector when the gain of the first gain stage, the gain of the second gain stage, and the loss of the attenuator stage are set for a first index point, and to save a value for the estimated power or amplitude as a previously sensed power or amplitude value; and means for setting the gain of the first gain stage, the gain of the second gain stage, the loss of the second attenuator stage to the second attenuation amount for a second index point, and to adjust the loss of the attenuator stage until the estimated power or amplitude sensed by the power or amplitude detector is about equal to the previously sensed power or amplitude value.

16. The apparatus of claim 12, wherein the first gain stage, the second gain stage, and the attenuator stage are radio frequency (RF) stages.

* * * * *